(12) United States Patent
Niyogi et al.

(10) Patent No.: US 9,224,644 B2
(45) Date of Patent: Dec. 29, 2015

(54) METHOD TO CONTROL DEPTH PROFILES OF DOPANTS USING A REMOTE PLASMA SOURCE

(71) Applicant: Intermolecular, Inc., San Jose, CA (US)

(72) Inventors: Sandip Niyogi, San Jose, CA (US); Amol Joshi, Sunnyvale, CA (US); Chi-I Lang, Cupertino, CA (US); Salil Mujumdar, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 75 days.

(21) Appl. No.: 13/726,972

(22) Filed: Dec. 26, 2012

(65) Prior Publication Data

US 2014/0179100 A1    Jun. 26, 2014

(51) Int. Cl.
| | |
|---|---|
| H01L 21/768 | (2006.01) |
| C23C 14/58 | (2006.01) |
| C23C 16/455 | (2006.01) |
| H01L 21/02 | (2006.01) |
| H01L 21/3115 | (2006.01) |
| H01L 21/3215 | (2006.01) |
| H01J 37/32 | (2006.01) |
| H01L 21/28 | (2006.01) |
| H01L 29/51 | (2006.01) |
| H01L 21/67 | (2006.01) |
| H01L 21/687 | (2006.01) |
| H01L 29/66 | (2006.01) |

(52) U.S. Cl.
CPC ...... *H01L 21/76886* (2013.01); *C23C 14/5826* (2013.01); *C23C 16/45536* (2013.01); *H01J 37/32357* (2013.01); *H01L 21/022* (2013.01); *H01L 21/0234* (2013.01); *H01L 21/02181* (2013.01); *H01L 21/02323* (2013.01); *H01L 21/02332* (2013.01); *H01L 21/28088* (2013.01); *H01L 21/28185* (2013.01); *H01L 21/28202* (2013.01); *H01L 21/31155* (2013.01); *H01L 21/3215* (2013.01); *H01L 21/67207* (2013.01); *H01L 21/68764* (2013.01); *H01L 21/68792* (2013.01); *H01L 29/517* (2013.01); *H01L 29/665* (2013.01); *H01L 29/6653* (2013.01)

(58) Field of Classification Search
CPC ............ H01L 21/02181; H01L 21/022; H01L 21/02252; H01L 21/0234; H01L 21/28202; H01L 21/3215; C23C 14/5826; C23C 16/45536
USPC ......... 438/216, 287, 770–772, 775–777, 788, 438/792

See application file for complete search history.

(56) References Cited

U.S. PATENT DOCUMENTS

| | | | |
|---|---|---|---|
| 6,946,368 | B1 | 9/2005 | Vandroux |
| 7,053,002 | B2 | 5/2006 | Cohen et al. |
| 7,348,264 | B2 | 3/2008 | Sasaki et al. |
| 7,358,511 | B2 | 4/2008 | Sasaki et al. |
| 7,407,874 | B2 | 8/2008 | Sasaki et al. |
| 7,759,254 | B2 | 7/2010 | Sasaki et al. |
| 7,780,793 | B2 | 8/2010 | Yang et al. |
| 2005/0070063 | A1* | 3/2005 | Im et al. .................... 438/240 |
| 2005/0260357 | A1* | 11/2005 | Olsen et al. ................ 427/569 |
| 2006/0040483 | A1* | 2/2006 | Niimi et al. ................ 438/591 |

\* cited by examiner

*Primary Examiner* — Thanhha Pham

(57) ABSTRACT

Methods and apparatus for processing using a remote plasma source are disclosed. The apparatus includes an outer chamber enclosing a substrate support, a remote plasma source, and a showerhead. A substrate heater can be mounted in the substrate support. A transport system moves the substrate support and is capable of positioning the substrate. The remote plasma source may be used to provide a plasma surface treatment or as a source to incorporate dopants into a pre-deposited layer.

12 Claims, 6 Drawing Sheets

600

Deposit a layer on a substrate
602

Provide ions or reactive species of a first dopant to the layer to incorporate the first dopant into the layer
604

Provide ions or reactive species of a second dopant to the layer to incorporate the second dopant into the layer
606

METHOD TO CONTROL DEPTH PROFILES OF DOPANTS USING A REMOTE PLASMA SOURCE

TECHNICAL FIELD

The present disclosure relates generally to methods and apparatuses for processing using a remote plasma source for surface treatment and layer formation.

BACKGROUND

Plasmas are widely used for a variety of treatment and layer deposition tasks in semiconductor fabrication and other thin film applications. These applications include subtractive processes such as wafer precleaning, contaminant removal, native oxide removal, photoresist removal, plasma etching, as well as treatment processes such as oxidation, nitridation, or hydridation of a layer both during and after formation. "Remote" plasma sources are frequently used, where the plasma is located at some distance from the surface to be treated or substrate on which a layer is being formed. The distance allows some filtering of the charged particles in the plasma. For example, the density of electrons and ions can be adjusted or removed from the generated plasma.

What is needed is a system that allows systematic exploration of process variables for using remote plasmas to incorporate atoms into a predeposited layer, thereby altering at least one of the layer's charge storage behavior, resistivity, refractive index, dielectric constant, or magnetic properties.

SUMMARY

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Methods and apparatus for processing using a remote plasma source are disclosed. The apparatus includes an outer chamber enclosing a substrate support, a remote plasma source, and a showerhead. A substrate heater can be mounted in the substrate support. A transport system moves the substrate support and is capable of positioning the substrate. The remote plasma source may be used to provide a plasma surface treatment or as a source to incorporate dopants into a pre-deposited layer.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

Figure 1:
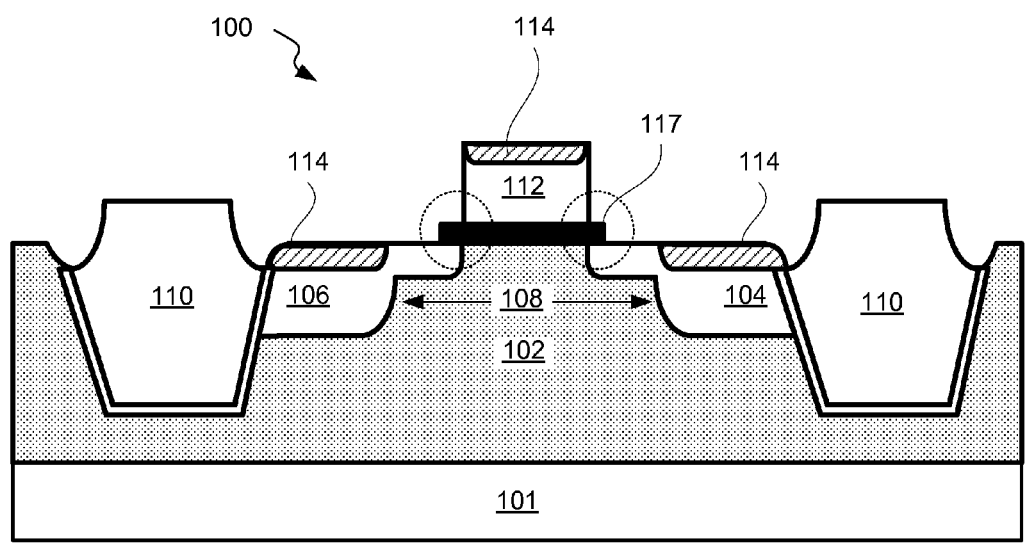
FIG. 1 illustrates a cross-sectional schematic diagram of a typical semiconductor device.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Before various embodiments are described in detail, it is to be understood that unless otherwise indicated, this invention is not limited to specific layer compositions or surface treatments. It is also to be understood that the terminology used herein is for the purpose of describing particular embodiments only and is not intended to limit the scope of the present invention.

It must be noted that as used herein and in the claims, the singular forms "a," "and" and "the" include plural referents unless the context clearly dictates otherwise. Thus, for example, reference to "a layer" includes two or more layers, and so forth.

Where a range of values is provided, it is understood that each intervening value, to the tenth of the unit of the lower limit unless the context clearly dictates otherwise, between the upper and lower limit of that range, and any other stated or intervening value in that stated range, is encompassed within the invention. The upper and lower limits of these smaller ranges may independently be included in the smaller ranges, and are also encompassed within the invention, subject to any specifically excluded limit in the stated range. Where the stated range includes one or both of the limits, ranges excluding either or both of those included limits are also included in the invention. The term "about" generally refers to ±10% of a stated value.

The term "site-isolated" as used herein refers to providing distinct processing conditions, such as controlled temperature, flow rates, chamber pressure, processing time, plasma composition, and plasma energies. Site isolation may provide complete isolation between regions or relative isolation between regions. Preferably, the relative isolation is sufficient to provide a control over processing conditions within ±10%, within ±5%, within ±2%, within ±1%, or within ±0.1% of the target conditions. Where one region is processed at a time, adjacent regions are generally protected from any exposure that would alter the substrate surface in a measurable way.

The term "site-isolated region" is used herein to refer to a localized area on a substrate which is, was, or is intended to be used for processing or formation of a selected material. The region can include one region and/or a series of regular or periodic regions predefined on the substrate. The region may have any convenient shape, e.g., circular, rectangular, elliptical, wedge-shaped, etc. In the semiconductor field, a region may be, for example, a test structure, single die, multiple dies, portion of a die, other defined portion of substrate, or an undefined area of a substrate, e.g., blanket substrate which is defined through the processing.

The term "substrate" as used herein may refer to any workpiece on which formation or treatment of material layers is desired. Substrates may include, without limitation, silicon, silica, sapphire, zinc oxide, SiC, AlN, GaN, Spinel, coated silicon, silicon on oxide, silicon carbide on oxide, glass, gallium nitride, indium nitride and aluminum nitride, and combinations (or alloys) thereof. The term "substrate" or "wafer" may be used interchangeably herein. Semiconductor wafer shapes and sizes can vary and include commonly used round wafers of 2", 4", 200 mm, or 300 mm in diameter.

The term "remote plasma source" as used herein refers to a plasma (e.g., an rf or microwave generated plasma) located at a distance from a deposition or treatment location sufficient to allow some filtering of the plasma components. For example, the density of ions and electrons can be adjusted by distance, and electrons and ions can also be filtered out using suitable electrode configurations, such as a grounded metal showerhead so that only atomic or molecular radicals reach the substrate.

Scaling of the gate lengths and equivalent gate oxide thicknesses is forcing the replacement of silicon dioxide as a gate dielectric by materials having high-dielectric constants (i.e., high-k materials). The goals include reduction of leakage currents and meeting requirements of reliability. Some additional consideration in selecting suitable replacement materials include silicon related band offsets, permittivity, dielectric breakdown strength, interface stability and quality with silicon, and the effective masses of the carriers.

Hafnium oxide is a candidate for silicon dioxide replacement as a gate dielectric material. It has a dielectric constant of about 25 at room temperature or about six times greater than that of silicon dioxide. While this dielectric constant is more than an order of magnitude smaller than for strontium titanium oxide ($SrTiO_3$), which has a dielectric constant of about 300, hafnium oxide has a conduction band offset of about 1.5-2.0 eV with respect to silicon, which is more than one order of magnitude higher than that of strontium titanium oxide.

The same properties of hafnium oxide that make it a leading candidate for a gate dielectric application also give hafnium oxide a high potential for other applications, such as insulating dielectrics in capacitive elements of various memory devices or, more specifically, of dynamic random-access memory (DRAM) capacitor stacks. Because of its high dielectric constant, a thick layer of hafnium oxide can be used to achieve the same performance as a much thinner silicon dioxide layer. However, thicker hafnium oxide layers have much lower leakage currents in comparison with thinner silicon oxide layers. In addition to having a high dielectric constant, hafnium oxide is thermodynamically stable with respect to silicon, with which it may be in contact in many semiconductor applications. Many modern complementary metal-oxide-semiconductor (CMOS) and DRAM processes involve high temperatures (e.g., 1000° C.) that are applied to substrates for a few seconds. Other applications of hafnium oxide include optical coatings, catalysts, and protective coatings (due to its hardness and thermal stability).

Hafnium oxide layers or structures may be deposited by a variety of physical vapor deposition (PVD) methods, including laser pulse ablation and sputtering. Other deposition techniques include CVD using β-diketonate precursors, alkoxide precursors, and chloride precursors. Atomic layer deposition (ALD) techniques may be used to prepare layers using both chloride and iodide precursors. Different deposition techniques yield different layer structures that may have different susceptibilities to etching.

Metal layers may be converted to metal compounds by the reaction with ions or reactive neutral species to form metal oxides, metal nitrides, metal carbides, metal silicides, metal chlorides, metal fluorides, and the like. These metal compounds may be used as diffusion barriers, local conductors, adhesion layers, work function (WF) tuning layers, and the like. The ions and/or reactive neutral species may be formed using a remote plasma source.

Semiconductor Device Examples

A brief description of semiconductor device examples is presented below to provide better understanding of various plasma surface treatments. Specifically, FIG. 1 illustrates a schematic representation of substrate portions including MOS device, 100, in accordance with some embodiments. The references below are made to positive metal-oxide semiconductor (PMOS) devices but other types of MOS devices can be used in the described processes and will be understood by one having ordinary skill in the art. MOS device 100 includes a p-doped substrate, 101, and an n-doped well, 102, disposed within substrate, 101. Substrate, 101, is typically a part of an overall wafer that may include other devices. Some of these devices may include silicon nitride, silicon oxide, polysilicon, or titanium nitride structures. P-doped substrate, 101, may include any suitable p-type dopants, such as boron and indium, and may be formed by any suitable technique. N-doped well, 102, may include any suitable n-type dopants, such as phosphorus and arsenic, and may be formed by any suitable technique. For example, n-doped well, 102, may be formed by doping substrate, 101, by ion implantation, for example.

MOS device, 100, also includes a conductive gate electrode, 112, that is separated from n-doped well, 102, by gate dielectric, 117. Gate electrode, 112, may include any suitable conductive material. In some embodiments, gate electrode, 112, may comprise polysilicon. In some embodiments, gate, 112, may include polysilicon doped with a p-type dopant, such as boron. Gate dielectric, 117, is formed from a high-k material (e.g. hafnium oxide). Other dielectric materials include zirconium oxide or aluminum oxide.

MOS device, 100, also includes p-doped source region, 104, and drain region, 106, (or simply the source and drain) disposed in n-doped well, 102. Source, 104, and drain, 106, are located on each side of gate electrode, 112, forming channel, 108, within n-doped well, 102. Source, 104, and drain, 106, may include a p-type dopant, such as boron. Source, 104, and drain, 106, may be formed by ion implantation. After forming source, 104, and drain, 106, MOS device, 100, may be subjected to an annealing and/or thermal activation process.

In some embodiments, source, 104, drain, 106, and gate electrode, 112, are covered with a layer of self-aligned silicide portions, 114, which may be also referred to as salicide portions or simply salicides. For example, a layer of cobalt may be deposited as a blanket layer and then thermally treated to form these silicide portions, 114. Other suitable materials include nickel and other refractory metals, such as tungsten, titanium, platinum, and palladium. After forming the blanket layer from the suitable metal, the layer is subjected to rapid thermal process (RTP) to react the metal with silicon contained within gate electrode, 112, as well as within source, 104, and drain, 106, to form a metal silicide. The RTP process may be performed at 700° C. to 1000° C.

MOS device, 100, may also include STI structures, 110, disposed on both sides of source, 104, and drain, 106. STI structures, 110, may include liners formed on the side and bottom walls by, for example, thermal oxidation of silicon of n-doped well, 102. The main body of STI structures is formed by filling a trench within n-doped well, 102, with a dielectric material, such as silicon oxide. Silicon oxide may be filled using high density plasma (HDP) deposition process.

As shown in FIG. 1, gate dielectric, 117, may protrude beyond gate electrode, 112. As such, gate dielectric, 117, may need to be partially etched such that it does not extend past electrode, 112, and does not interfere with subsequent formation of liners and spacers on sidewalls of gate electrode, 112.

In some embodiments, the gate dielectric, 117, and/or the gate electrode, 112, may receive a surface plasma treatment to improve the performance of the device.

Figure 2:
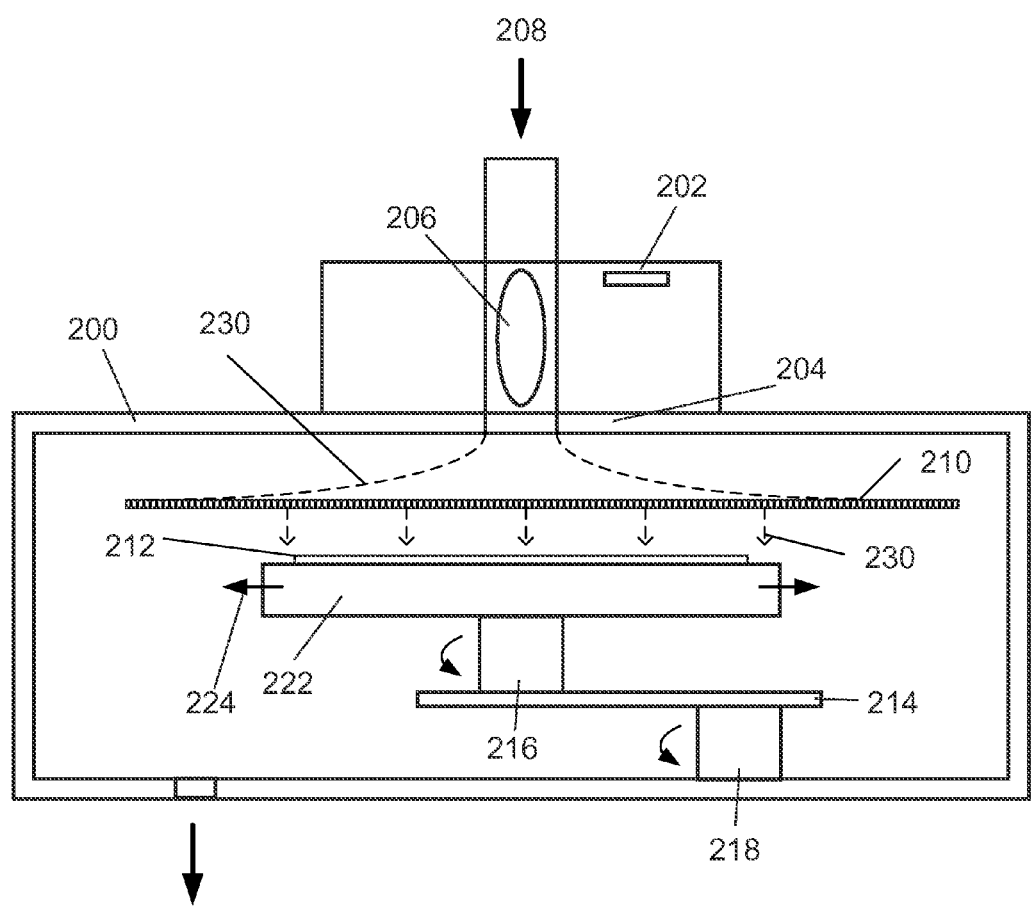
FIG. 2 illustrates a schematic diagram for plasma surface treatment according to some embodiments.

FIG. 2 illustrates the overall layout of some embodiments of a system enabling combinatorial processing using a remote plasma source. A discussion of the system may be found in co-owned U.S. patent application Ser. No. 13/328,129 filed on Dec. 16, 2011 which is herein incorporated by reference for all purposes. Portions of the '129 application are included herein to enhance the understanding of the present disclosure. A process chamber, 200, is provided. A remote plasma source, 202, is mounted on a chamber lid, 204, either directly as illustrated or through a short flange. The plasma, 206, is entrained into a central gas flow, 208, which is directed toward a showerhead, 210. The showerhead is disposed within the processing chamber between the remote plasma source and the substrate and is in close proximity to the substrate, 212. The showerhead further includes multiple regions, each region containing an inert gas port. The showerhead is operable to provide exposure of reactive species from the remote plasma source to regions of the substrate. A substrate positioning system, 214, can position the substrate, 212, directly under the showerhead, 210. As illustrated in FIG. 2, the substrate positioning system can provide two displaced axes of rotation, 216, and 218. The two-axis rotation configuration illustrated can provide 360° of rotation for the upper rotation (providing an angular coordinate) and 60° of rotation for the lower axis (approximating a radial coordinate) to provide all possible substrate positions. Alternatively, other positioning systems such as X-Y translators can also be used. In addition, substrate support, 222, may move in a vertical direction. It should be appreciated that the rotation and movement in the vertical direction may be achieved through known drive mechanisms which include magnetic drives, linear drives, worm screws, lead screws, a differentially pumped rotary feed through drive, etc.

The substrate support, 222, can include a substrate heater (e.g., resistive or inductive) and can be sized to be larger than the largest substrate to be processed. Substrate temperatures for most remote plasma applications are less than 500 C, although any suitable heater power and range of temperature control. The substrate support, 222, can also be configured to provide a gas purge flow, 224, for example from the edges of the support, using argon, helium, or any other gas that is not reactive under the process conditions.

Figure 3:
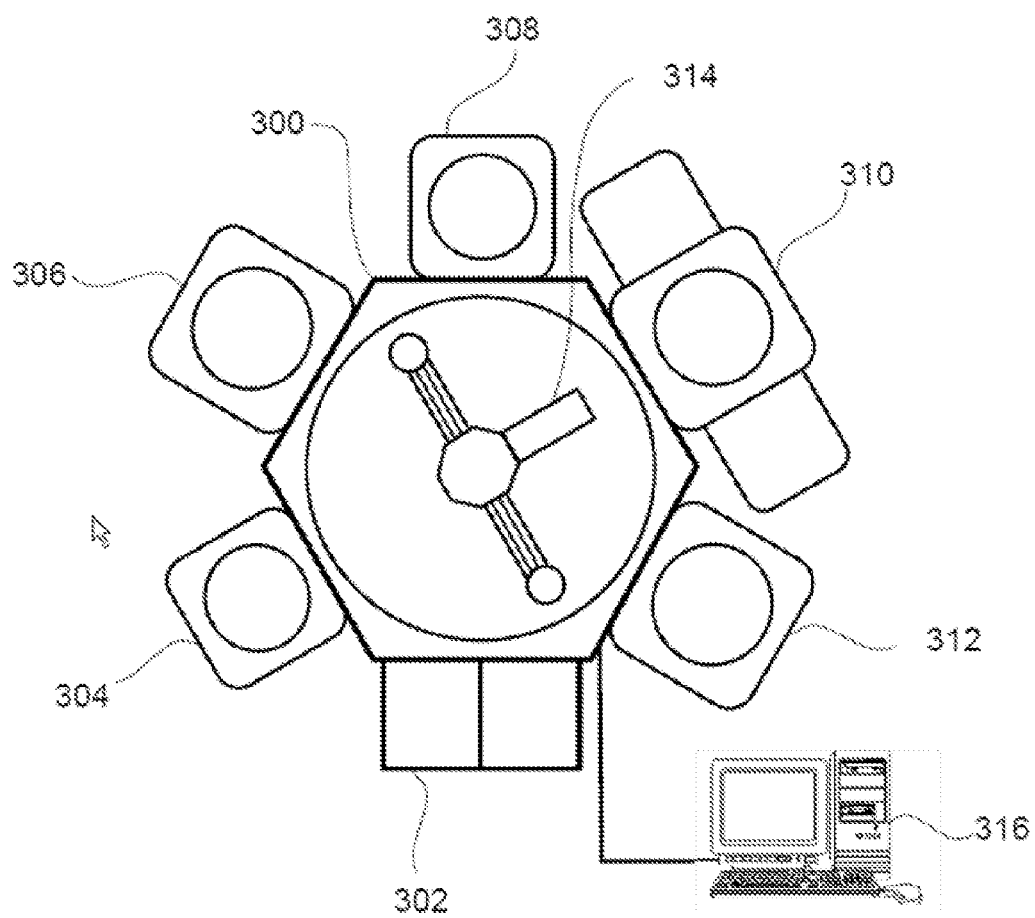
FIG. 3 illustrates a processing system enabling plasma surface treatment according to some embodiments.

FIG. 3 is a simplified schematic diagram illustrating an integrated processing system in accordance with some embodiments of the invention. The processing system includes a frame, 300, supporting a plurality of processing modules. It will be appreciated that frame, 300, may be a unitary frame in accordance with some embodiments. In some embodiments, the environment within frame, 300, is controlled. A load lock, 302, provides access into the plurality of modules of the processing system. A robot, 314, provides for the movement of substrates (and masks) between the modules and for the movement into and out of the load lock, 302. Modules, 304-312, may be any set of modules and preferably include one or more processing modules. For example, module, 304, may be an orientation/degassing module, module, 306, may be a clean module, either plasma or non-plasma based, modules, 308, and/or 310, may be dual purpose modules. Module, 312, may provide conventional clean or degas as necessary.

Any type of chamber or combination of chambers may be implemented and the description herein is merely illustrative of one possible combination and not meant to limit the potential chamber or processes that can be supported to combine combinatorial processing or combinatorial plus conventional processing of a substrate or wafer. In some embodiments, a centralized controller, i.e., computing device, 316, may control the processes of the processing system. Further details of one possible processing system are described in U.S. application Ser. Nos. 11/672,478 and 11/672,473, the entire disclosures of which are herein incorporated by reference. In a processing system, a plurality of methods may be employed to deposit material upon a substrate.

Plasmas are widely used for a variety of treatment and layer deposition tasks in semiconductor fabrication. These applications include subtractive processes such as wafer precleaning, contaminant removal, native oxide removal, photoresist removal, as well as treatment processes such as oxidation, nitridation, or hydridation of a layer both during and after formation. "Remote" plasma sources are frequently used, where the plasma is located at some distance from the surface to be treated or substrate on which a layer is to be formed. The distance allows some adjusting of the charged particles in the plasma. For example, the density of ions and electrons can be adjusted by distance, the electrons and ions can be removed from the generated plasma using suitable electrode configurations such as a grounded metal showerhead, so that, for example, only atomic radicals and molecule radicals (but not ions) reach the substrate.

The plasma generator for a remote plasma source can use any known means of coupling energy into atoms or molecules to ionize them and create a plasma. The energy source can be, for example, electromagnetic energy such as microwaves, radio frequency energy, or lasers.

Typically, systems using remote plasma sources were designed to treat the entire area of a substrate, such as a 300 mm wafer. Combinatorial processing is difficult and expensive when the entire area of a substrate can only receive a single process variation. Some embodiments of the present invention overcome this limitation by providing a remote plasma source, an associated substrate positioning system, and a site isolation system that allows a selected region of a substrate to be processed while the remaining regions of the substrate are protected from exposure to the plasma and reactive radical species unless or until such exposure is intended.

Accordingly, an apparatus for processing using remote plasma exposure of a substrate is disclosed. The apparatus comprises an outer chamber containing: a remote plasma source, a showerhead, and a transport system comprising a substrate support and capable of positioning the substrate. The plasma exposure process parameters can be varied. The plasma exposure process parameters comprise one or more of source gases for the plasma generator, plasma filtering parameters, exposure time, gas flow rate, frequency, plasma generator power, plasma generation method, chamber pressure, substrate temperature, distance between plasma source and substrate, substrate bias voltage, or combinations thereof.

In some embodiments, methods of varying surface exposure to a plasma or reactive radical species are provided. The methods comprise exposing a substrate to a plasma or reactive radical species from a remote plasma source under a first set of process parameters, and exposing a substrate to a plasma or reactive radical species from a remote plasma source under a second set of process parameters. The process parameters can be varied in a combinatorial manner. Typically, the process parameters comprise one or more of source gases for the plasma generator, plasma filtering parameters, exposure times, gas flow rates, frequencies, plasma generator powers, plasma generation methods, chamber pressures, substrate temperatures, distances between plasma source and substrate, substrate bias voltages, or combinations thereof.

In some embodiments, a layer can be exposed to a plasma surface treatment, thereby altering at least one of the layer's charge storage behavior, resistivity, refractive index, dielectric constant, or magnetic properties. In some embodiments, atoms from the plasma surface treatment are incorporated into the layer. Examples of suitable atoms include O, N, C, S, Cl, F, H, and the like. The atoms may be incorporated into the layer as ions or as reactive neutral species. Examples of gases that may be used in the remote plasma source to generate the ions or reactive neutral species include $H_2$, $O_2$, $N_2$, $N_2O$, $NH_3$, $BCl_3$, $NF_3$, and the like.

Figure 4:
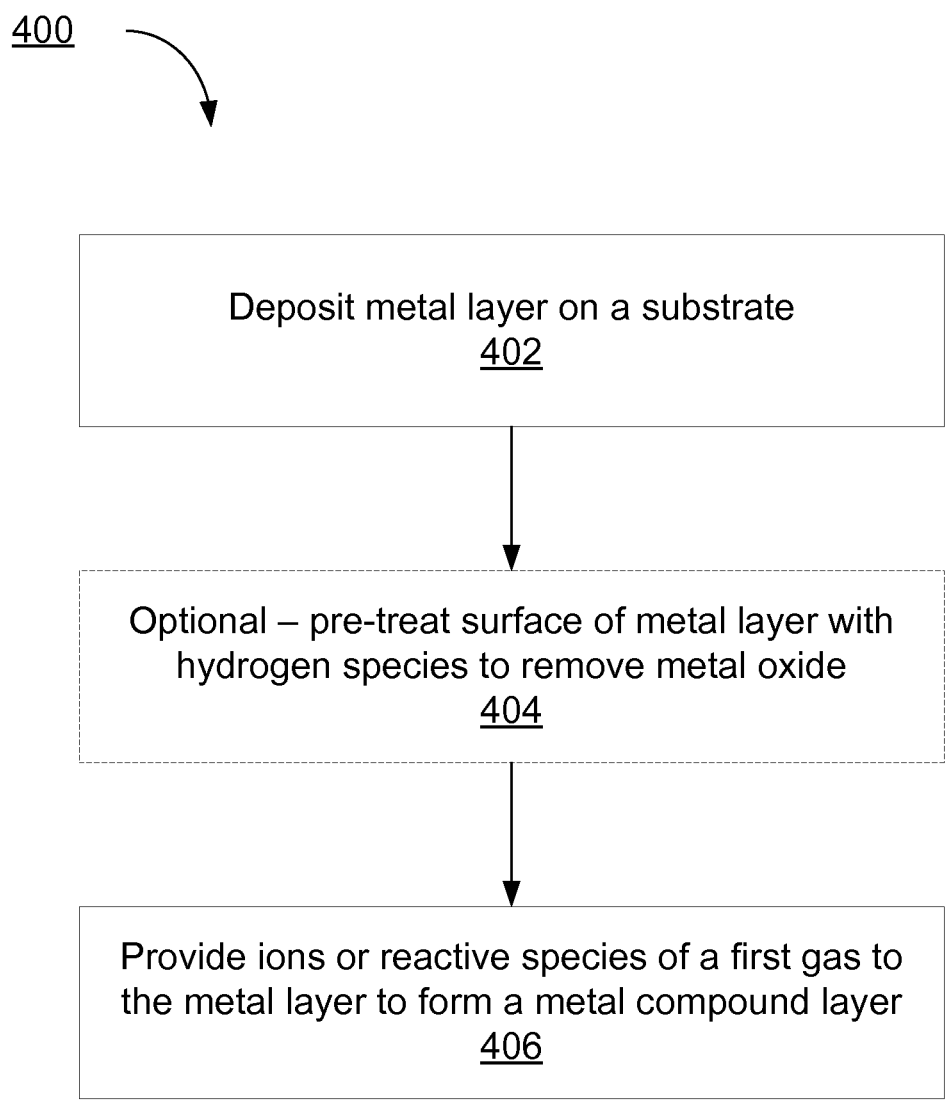
FIG. 4 illustrates a flow chart of a method according to some embodiments.

In some embodiments, ions or reactive neutral species may be incorporated into a metal layer to form a metal compound layer (e.g. processing a metal layer). FIG. 4 presents a flow chart illustrating some of the steps according to methods of some embodiments. The method would include the deposition of the metal layer on a substrate, 402. The substrate may include other layers previously formed or deposited. The substrate would be placed into a processing system capable of exposing the substrate to a flow of ions or reactive neutral species as discussed with reference to FIG. 2. Optionally, the surface of the metal layer may be exposed to hydrogen ions or reactive neutral hydrogen species generated by the remote plasma source to remove metal oxide species that may have formed on the surface of the metal layer, 404. The metal layer would then be exposed to ions or reactive neutral species to form a metal compound layer, 406. The ions or reactive neutral species can be generated by a remote plasma source and provided to the surface of the metal layer. Examples of gases that may be used in the remote plasma source to generate the ions or reactive neutral species include $H_2$, $O_2$, $N_2$, $N_2O$, $NH_3$, $BCl_3$, $NF_3$, and the like. Examples of suitable metal layers include titanium, tantalum, tungsten, and the like. As an example, a metal titanium layer can be pre-treated with hydrogen species from a remote plasma, followed by treatment with nitrogen species to form a titanium nitride layer. Those skilled in the art will understand that a similar method may be used to incorporate oxygen into a metal layer to form a metal oxide. Generally, the method may be extended to form metal oxides, metal nitrides, metal carbides, metal fluorides, and the like.

In some embodiments, dopants may be added to layers, thereby altering at least one of the layer's charge storage behavior, resistivity, refractive index, dielectric constant, or magnetic properties. In some embodiments, the layer is a dielectric layer. Examples of dielectric layer applications include gate dielectric layers or capacitor dielectric layers. Examples of suitable dielectric layer materials include silicon oxide, aluminum oxide, hafnium oxide, zirconium oxide, and the like. Examples of suitable dopant atoms include O, N, C, Cl, F, and the like. The dopant atoms may be incorporated into the layer as ions or as reactive neutral species. Examples of gases that may be used in the remote plasma source to generate the ions or reactive neutral species include $H_2$, $O_2$, $N_2$, $N_2O$, $NH_3$, $BCl_3$, $NF_3$, and the like.

Figure 5:
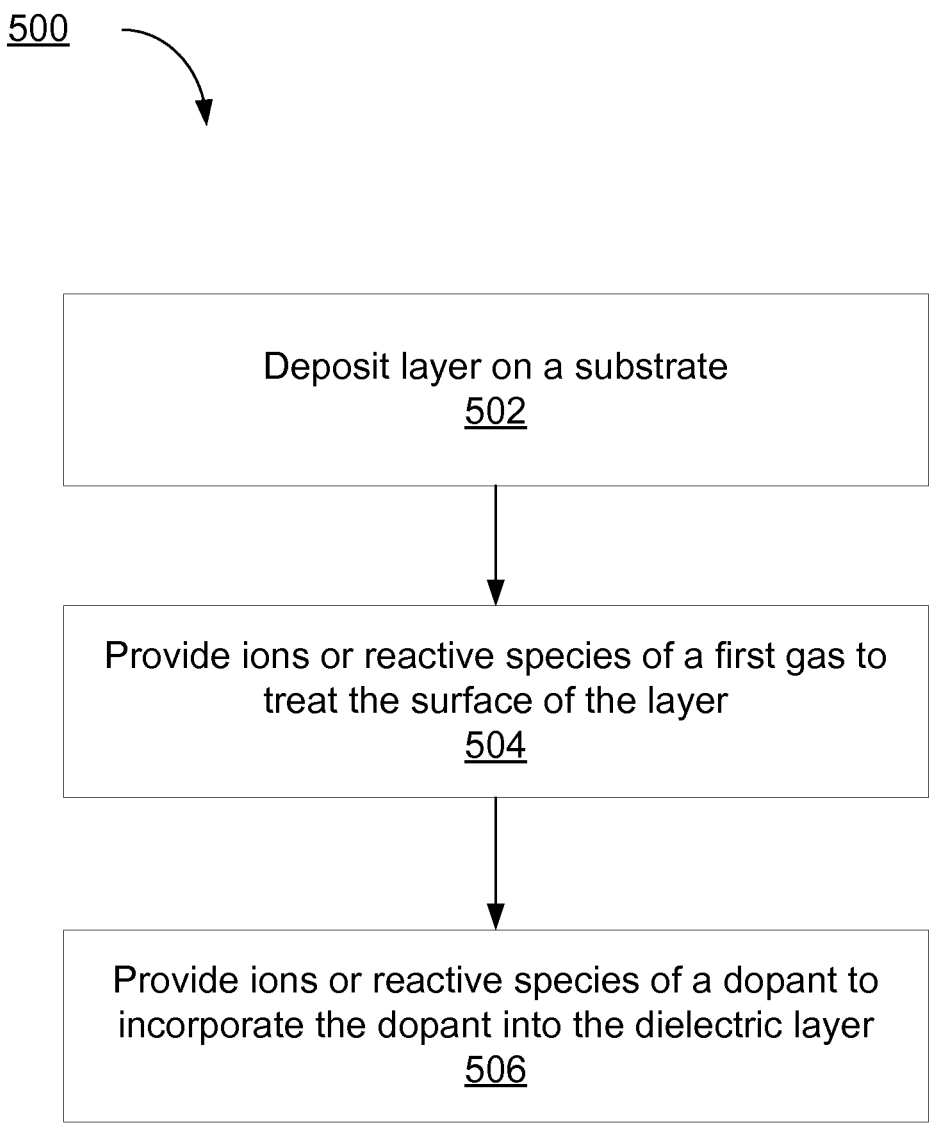
FIG. 5 illustrates a flow chart of a method according to some embodiments.

FIG. 5 presents a flow chart illustrating some of the steps according to methods of some embodiments. The method would include the deposition of the layer on a substrate, 502. In some embodiments, the layer is a dielectric layer. The substrate may include other layers previously formed or deposited. The substrate would be placed into a processing system capable of exposing the substrate to a flow of ions or reactive neutral species as discussed with reference to FIG. 2. The layer would then be exposed to ions or reactive neutral species of a first gas to treat the surface of the layer, 504. The layer would then be exposed to ions or reactive neutral species of a dopant to incorporate the dopants into the dielectric layer, 506.

In some embodiments, dopants may be added to dielectric layers, thereby altering at least one of the layer's charge storage behavior, resistivity, refractive index, dielectric constant, or magnetic properties. The dopants may be added through the exposure of the dielectric layer to more than one gas sequentially. Examples of dielectric layer applications include gate dielectric layers or capacitor dielectric layers. Examples of suitable dielectric layer materials include silicon oxide, aluminum oxide, hafnium oxide, zirconium oxide, and the like. The dielectric layer may be treated with ions or reactive neutral species prior to the doping step to alter the incorporation of the dopant into the dielectric layer. Examples of gases that may be used in the remote plasma source to generate the ions or reactive neutral species of the treatment gas include $H_2$, $O_2$, $N_2$, $N_2O$, $NH_3$, and the like.

Examples of suitable dopant atoms include O, N, C, S, Cl, F, H, and the like. The dopant atoms may be incorporated into the layer as ions or as reactive neutral species. Examples of gases that may be used in the remote plasma source to generate the ions or reactive neutral species of the dopant include $H_2$, $O_2$, $N_2$, $N_2O$, $NH_3$, $BCl_3$, $NF_3$, and the like. Generally, the high-k dielectric materials include metal oxides. In some embodiments, the methods discussed with respect to FIG. 5 can be used to form one of metal oxy-nitride, metal oxy-carbide, metal oxy-silicide, metal oxy-chloride, metal oxy-fluoride materials, and the like.

Figure 6:
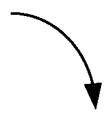
FIG. 6 illustrates a flow chart of a method according to some embodiments.

FIG. 6 presents a flow chart illustrating some of the steps according to methods of some embodiments. In some embodiments, the layer is a dielectric layer. The method would include the deposition of the layer on a substrate, 602. The substrate may include other layers previously formed or deposited. The substrate would be placed into a processing system capable of exposing the substrate to a flow of ions or reactive neutral species as discussed with reference to FIG. 2. The ions or reactive neutral species can be generated by a remote plasma source and provided to the layer. The layer would then be exposed to a first species of dopant ions or reactive neutral dopant species to incorporate the dopants into the layer, 604. This first exposure may incorporate a portion of the first dopant type into the layer or may prepare the surface for the incorporation of a subsequent second dopant. The layer would then be exposed to a second species of dopant ions or reactive neutral dopant species to incorporate the dopants into the layer, 606. The second dopant would be incorporated into the layer. Generally, the high-k dielectric materials include metal oxides. In some embodiments, the exposing the dielectric layer to a first dopant ions or reactive species and the exposing the dielectric layer to a second dopant ions or reactive species are repeated a plurality of times.

As an example of the method discussed with reference to FIG. 6, a substrate including a hafnium oxide dielectric layer deposited thereon may be placed in a processing chamber. The hafnium oxide dielectric layer may be exposed to a flow of oxygen radicals for 15 seconds at a pressure of 80 mTorr. The substrate may be heated to 120 C. The oxygen radicals may be produced from a remote plasma source operating at 1000 W. Next, the hafnium oxide dielectric layer may be exposed to a flow of nitrogen radicals for 15 seconds at a pressure of 80 mTorr. The substrate may be heated to 120 C. The nitrogen radicals may be produced from a remote plasma source operating at 200 W. Without being bound by theory, it is believed that the initial exposure of the hafnium oxide dielectric layer to the oxygen radicals decreases the number of oxygen vacancies formed in the hafnium oxide dielectric layer during deposition. The decrease in the number of oxygen vacancies limits the concentration of nitrogen dopant incorporated into the layer (i.e. a nitrogen doped hafnium oxide material). It has been found that the electrical characteristics of the layer are degraded if the concentration of nitrogen is too high. Advantageously, the nitrogen concentration in the hafnium oxide dielectric layer should be between 2 atomic % and 10 atomic %.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for doping a layer, the method comprising:
   depositing the layer on a substrate;
   generating ions or reactive species of a first gas using a remote plasma source;
   providing the ions or reactive species of the first gas to the layer, thereby treating a surface of the layer;
   generating ions or reactive species of a dopant using a remote plasma source;
   providing the ions or reactive species of the dopant to said treated surface of the layer after the providing of the ions or reactive species of the first gas to the layer, thereby incorporating the dopant into the layer;
   wherein the first gas
comprises at least one of $H_2$, $O_2$, $N_2$, $N_2O$, or $NH_3$; and
   wherein a gas used to generate the ions or reactive species of the dopant comprises at least one of $H_2$, $BCl_3$, or $NF_3$.

2. The method of claim 1 wherein the layer comprises at least one of silicon oxide, aluminum oxide, hafnium oxide, or zirconium oxide.

3. The method of claim 2 wherein the layer comprises hafnium oxide.

4. The method of claim 1 wherein the gas used to generate the ions or reactive species of the dopant comprises $BCl_3$ or $NF_3$.

5. The method of claim 1 wherein the ions or reactive species of the first gas comprises oxygen radicals, and wherein the providing of the oxygen radicals the layer causes a reduction in oxygen vacancies at the surface of the layer.

6. The method of claim 1 wherein at least one of the providing the ions or reactive species of the first gas to the layer and the providing the ions or reactive species of the dopant to said treated surface of the layer is performed using combinatorially varied processing conditions for different regions of the layer.

7. A method for doping a layer, the method comprising:
   depositing the layer on a substrate, wherein the layer comprises at least one of silicon oxide, aluminum oxide, hafnium oxide, or zirconium oxide;
   generating oxygen radicals using a remote plasma source;
   providing the oxygen radicals to the layer, thereby causing a reduction in oxygen vacancies at a surface of the layer;
   generating ions or reactive species of a dopant using a remote plasma source; and
   providing the ions or reactive species of the dopant to the surface of the layer with said reduced oxygen vacancies after the providing of the oxygen radicals to the layer, thereby incorporating the dopant into the layer,
   wherein the dopant comprises at least one of C, S, Cl, or F.

8. The method of claim 7 wherein at least one of the providing the oxygen radicals to the layer and the providing the ions or reactive species of the dopant to surface of the layer is performed using combinatorially varied processing conditions for different regions of the layer.

9. The method of claim 7 wherein the layer comprises hafnium oxide.

10. The method of claim 9 wherein the concentration of nitrogen in the hafnium oxide is between 2 atomic % and 10 atomic %.

11. A method for doping a layer, the method comprising:
    depositing the layer on a substrate;
    generating ions or reactive species of a gas using a remote plasma source;
    providing the ions or reactive species of the gas to the layer, thereby treating a surface of the layer;
    generating ions or reactive species of a dopant using a remote plasma source; and
    providing the ions or reactive species of the dopant to said treated surface of the layer after the providing of the ions or reactive species of the gas to the layer, thereby incorporating the dopant into the layer,
    wherein the gas comprises at least one of $H_2$, $O_2$, $N_2$, $N_2O$, or $NH_3$, and the dopant comprises at least one of C, S, Cl, or F.

12. The method of claim 11 wherein at least one of the providing the ions or reactive species of the gas to the layer and the providing the ions or reactive species of the dopant to said treated surface of the layer is performed using combinatorially varied processing conditions for different regions of the layer.

* * * * *